(12) United States Patent
Purdy

(10) Patent No.: US 6,988,045 B2
(45) Date of Patent: Jan. 17, 2006

(54) DYNAMIC METROLOGY SAMPLING METHODS, AND SYSTEM FOR PERFORMING SAME

(75) Inventor: Matthew A. Purdy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 248 days.

(21) Appl. No.: 10/634,013

(22) Filed: Aug. 4, 2003

(65) Prior Publication Data

US 2005/0033467 A1 Feb. 10, 2005

(51) Int. Cl.
*G06F 19/00* (2006.01)
(52) U.S. Cl. ....................................................... 702/83
(58) Field of Classification Search .................. 702/83
See application file for complete search history.

(56) References Cited

U.S. PATENT DOCUMENTS

| | | | |
|---|---|---|---|
| 5,541,846 A | 7/1996 | Secrest ................... | 364/468.17 |
| 6,442,496 B1 | 8/2002 | Pasadyn et al. ............... | 702/83 |
| 6,477,432 B1 * | 11/2002 | Chen et al. ................... | 700/51 |
| 6,577,972 B2 * | 6/2003 | Yanaru et al. ................. | 702/83 |

FOREIGN PATENT DOCUMENTS

WO WO 02/23289 A2 3/2002

OTHER PUBLICATIONS

Williams et al., "Optimized Sample Planning for Wafer Defect Inspection," IEEE, pp. 43-46, 1999.

* cited by examiner

*Primary Examiner*—John Barlow
*Assistant Examiner*—Cindy D. Khuu
(74) *Attorney, Agent, or Firm*—Williams, Morgan & Amerson, P.C.

(57) ABSTRACT

The present invention is generally directed to various methods and systems for adaptive metrology sampling plans that may be employed to monitor various manufacturing processes. In one example, the method includes creating a plurality of metrology sampling rules, assigning each of the metrology sampling rules a sampling weight value, identifying at least one workpiece that satisfies at least one of the metrology sampling rules, assigning the sampling weight value for each of the satisfied metrology sampling rules with the identified workpieces that satisfy the rules, and indicating a metrology operation should be performed when a cumulative total of the sampling weight values is at least equal to a pre-established trigger value.

32 Claims, 5 Drawing Sheets

| RULE NUMBER | RULE NAME | METROLOGY OPERATION | MATCHING RULE SET |
|---|---|---|---|
| 1 | E40M1CD | 5305 | entity = ET40 at oper. = 5230 |
| 2 | E40M1FI | 5315 | entity = ET40 at oper. = 5230 |
| 3 | E39M1CD | 5305 | entity = ET39 at oper. = 5230 |
| 4 | E39M1FI | 5315 | entity = ET39 at oper. = 5230 |
| 5 | STP64M1CD | 5305 | entity = STP64 at oper. = 5170 |
| 6 | R02DM1CD | 5305 | product = 98R02D |
| 7 | My Rule | 5305 | (product = 98M16B) AND (entity = STP64 at oper. = 5170) AND (entity = ET38 at oper. = 5230) |

Table 1

| RULE NUMBER | RULE NAME | METROLOGY OPERATION | SAMPLING WEIGHT |
|---|---|---|---|
| 1 | E40M1CD | 5305 | 10 |
| 2 | E40M1FI | 5315 | 5 |
| 3 | E39M1CD | 5305 | 15 |
| 4 | E39M1FI | 5315 | 5 |
| 5 | STP64M1CD | 5305 | 10 |
| 6 | R02DM1CD | 5305 | 10 |
| 7 | My Rule | 5305 | 15 |

Table 2

| LOT | PRODUCT | 5170 entity | 5230 entity |
|---|---|---|---|
| J10 | 98R02D | STP65 | ET39 |
| J20 | 98R02D | STP65 | ET40 |
| J30 | 98R02D | STP65 | ET39 |
| J40 | 98M16D | STP64 | ET40 |
| J50 | 98R02D | STP64 | ET39 |
| J60 | 98R02D | STP65 | ET40 |
| J70 | 98M16D | STP65 | ET39 |
| J80 | 98R02D | STP65 | ET40 |

Table 3

| LOT | E40M1CD | E39M1CD | STP64M1CD | R02M1CD | My Rule |
|---|---|---|---|---|---|
| J10 | — | 15 | — | 10 | — |
| J20 | 10 | — | — | 20 | — |
| J30 | — | 30 | — | 30 | — |
| J40 | 20 | — | 10 | — | — |
| J50 | — | 45 | 20 | 40 | — |
| J60 | 30 | — | — | 50 | — |
| J70 | — | 60 | — | — | — |
| J80 | 40 | — | — | 60 | — |

Table 4

| Operation | Trigger Value |
|---|---|
| 5305 | 50 |
| 5315 | 60 |

| LOT | RULE 1 E40M1CD | RULE 3 E39M1CD | RULE 5 STP64M1CD | RULE 6 R02M1CD | RULE 7 My Rule | Sample ? |
|---|---|---|---|---|---|---|
| J10 | — | 15 | — | 10 | — | NO |
| J20 | 10 | — | — | 20 | — | NO |
| J30 | — | 30 | — | 30 | — | NO |
| J40 | 20 | — | 10 | — | — | NO |
| J50 | — | 45 | 20 | 40 | — | NO |
| J60 | 30 | — | — | 50 | — | YES |
| J70 | — | 60 | — | — | — | YES |
| J80 | 40 | — | — | 60 | — | YES |

Table 5

| LOT | RULE 1 E40M1CD | RULE 3 E39M1CD | RULE 5 STP64M1CD | RULE 6 R02M1CD | RULE 7 My Rule | Sample ? |
|---|---|---|---|---|---|---|
| J10 | — | 15 | — | 10 | — | NO |
| J20 | 10 | — | — | 20 | — | NO |
| J30 | — | 30 | — | 30 | — | NO |
| J40 | 20 | — | 10 | — | — | NO |
| J50 | — | 45 | 20 | 40 | — | NO |
| J60 | 30/0 | — | — | 50/0 | — | YES |
| J70 | — | 60/10 | — | — | — | YES |
| J80 | 10 | — | — | 10 | — | NO |

Table 6

DYNAMIC METROLOGY SAMPLING METHODS, AND SYSTEM FOR PERFORMING SAME

BACKGROUND OF THE INVENTION

1. Field of the Invention

The present invention is generally directed to the field of adaptive metrology sampling techniques, and, more particularly, to various methods and systems for adaptive metrology sampling plans that may be employed to monitor various manufacturing processes.

2. Description of the Related Art

In virtually all manufacturing environments, metrology data is acquired to ensure that various manufacturing processes are operating as expected and desired. In an ideal control situation, all metrology would be taken for all of the workpieces or material processed. However, in reality, such an exhaustive metrology sampling plan is not practical. Acquisition of metrology data does not add any value to the workpieces or material processed. Moreover, acquisition of metrology data is time-consuming and the acquisition process requires the use of expensive metrology tools and scarce metrology technicians or engineers. As such, there is a business-based desire to limit the amount of sampling done to a minimum level that is capable of providing useful information to monitor and control the various manufacturing processes.

In the context of semiconductor manufacturing operations, metrology sampling is generally performed as a set of fixed, independent rules as to which lots of wafers are to be sampled. For example, most previous sampling systems involve sampling based upon a fixed percentage, e.g., 20%, of the workpieces (or lots) processed through a tool or process operation, or based upon a preset pattern, e.g., every other lot (X-X-X), or measure the first workpiece and do not measure the next three (X - - - X - - - ). Additionally, ad hoc sampling decisions are sometimes also made at the discretion of the engineering department to increase the level of sampling at a particular tool or set of tools. Such multiple, uncoordinated sampling inputs may lead to over-sampling of a production line.

To reduce the risk of over-sampling, a common approach is to reduce the sampling rules to apply to only key process tools at a low rate. By taking this approach, the additional sampling from ad hoc decisions or other sources does not over-burden the capacity of the metrology tools and personnel. However, such a sampling approach introduces a risk that a problem with a non-key process tool could remain undetected due to the lack of a specific sampling rule for the non-key process tool.

By way of example only, in the context of a semiconductor manufacturing facility, it may be desirable to set up a metrology sampling plan to investigate potential etching defects. The process tools that may have an impact on causing such defects may be a collection of four etch tools and five solvent sinks (where photoresist mask material is stripped after the etch process is performed. A typical sampling rule may state that 30% of the lots processed through each of the four etch tools be subjected to metrology testing. However, the actual metrology testing is not performed until after the identified lots are processed through both an etch tool and one of the five solvent sinks. In adopting this approach, it is assumed that, due to randomness, the solvent sink tools will also be adequately sampled. However, in practice, such metrology may not provide adequate sampling of the non-key process tools, i.e., the solvent sinks. That is, due to random choice, the lots that are processed in the etch tools may not be equally distributed as they are processed downstream in the solvent sinks. As a result, some of the solvent sink tools may be over-sampled, while other solvent sink tools may be under-sampled.

Such a metrology sampling plan wherein it is assumed that all of the desired tools are being adequately samples is unacceptable for many manufacturing processes. Relying on such assumptions may lead to situations where a particular process tool that is not producing acceptable results may go undetected for a period of time. As a result, manufacturing costs increase and manufacturing efficiencies and yield may decrease. In general, what is desired is a metrology sampling methodology that minimizes the number of workpieces, e.g., lots, wafers, sampled while still adequately sampling the process tools and operations desired to be sampled.

The present invention is directed to various methods and systems that may solve, or at least reduce, some or all of the aforementioned problems.

SUMMARY OF THE INVENTION

The present invention is generally directed to various methods and systems for adaptive metrology sampling plans that may be employed to monitor various manufacturing processes. In one illustrative embodiment, the method comprises creating a plurality of metrology sampling rules, assigning each of the metrology sampling rules a sampling weight value, identifying at least one workpiece that satisfies at least one of the metrology sampling rules, associating the sampling weight value for each of the satisfied metrology sampling rules with the identified workpieces that satisfy the rules, and indicating a metrology operation should be performed when a cumulative total of the sampling weight values is at least equal to a pre-established trigger value.

In another illustrative embodiment, the method comprises creating a plurality of metrology sampling rules, assigning each of the metrology sampling rules a sampling weight value, identifying at least one workpiece that satisfies at least one of the metrology sampling rules, associating the sampling weight value for each of the satisfied metrology sampling rules with the identified workpieces that satisfy the rules, and indicating a metrology operation should be performed when a cumulative total of the sampling weight values for one of the metrology sampling rules is at least equal to a pre-established trigger value.

In a further illustrative embodiment, the method comprises creating a plurality of metrology sampling rules, assigning each of the metrology sampling rules a sampling weight value, identifying at least one workpiece that satisfies at least one of the metrology sampling rules, associating the sampling weight value for each of the satisfied metrology sampling rules with the identified workpieces that satisfy the rules, and indicating a metrology operation should be performed when a cumulative total of the sampling weight values for one of the workpieces is at least equal to a pre-established trigger value.

BRIEF DESCRIPTION OF THE DRAWINGS

The invention may be understood by reference to the following description taken in conjunction with the accompanying drawings, in which like reference numerals identify like elements, and in which.

Tables 1–6 depict one illustrative embodiment of the present invention; and

Figure 1:
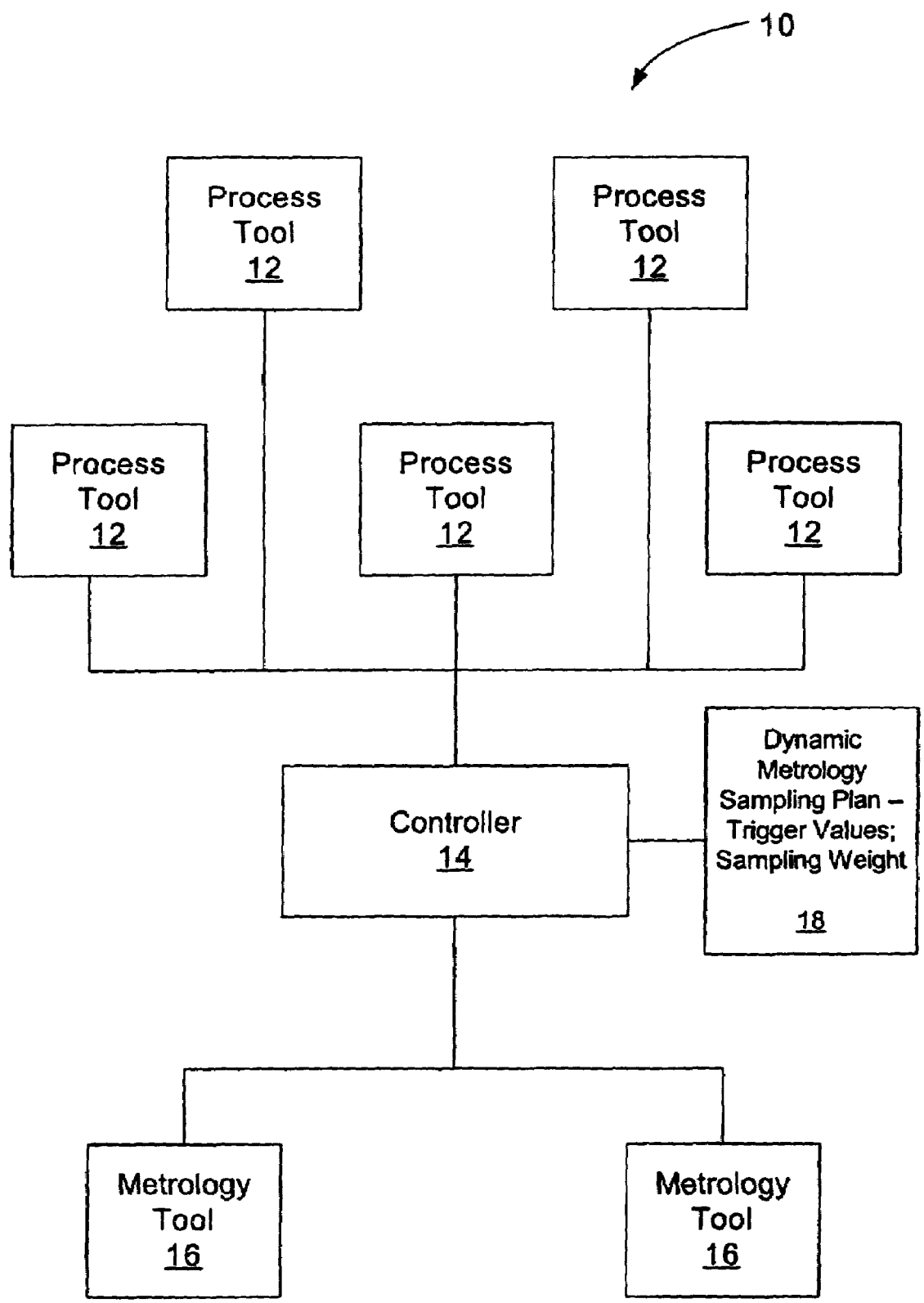
FIG. 1 is a schematic depiction of one illustrative embodiment of a system that may be employed with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

By way of example only, the present invention will be discussed in the context of creating an adaptive sampling scheme in connection with the formation of features at the so-called "metal one" level of an integrated circuit device. Typically, a plurality conductive contacts will be formed to provide electrical connection to the actual semiconductor device, e.g., a trench. The metal one level of conductive interconnections in an integrated circuit device generally refers to the first level of conductive lines that are coupled to previously formed conductive contacts. Forming such features at the metal one level involves, in some applications, forming a layer of metal, forming a patterned layer of photoresist (photomask) above the layer of metal using a stepper tool, performing an etch process on the metal layer using an etch tool, and stripping the remaining photoresist mask after the etch process is performed using a solvent-strip tool. In general, the critical dimension of the features and/or the number of particle defects associated with such processing operations may be the subject of metrology operations to determine the effectiveness of the processes employed and the acceptability of the resulting features. However, after a complete reading of the present application, those skilled in the art will appreciate that the present invention is not limited to the specifically discussed example. Rather, the present invention may be employed in connection with a vast variety of manufacturing operations, tools and devices. Thus, the present invention should not be considered as limited to any particular process operation or to semiconductor manufacturing operations unless such limitations are expressly set forth in the appended claims.

Tables 1–6 are provided to describe one illustrative example of how the methodologies of the present invention may be employed. Metrology sampling can be thought of as having two components—a set of logical statements describing when the sampling rule applies and what to do when the sampling rule should be used. For convenience, a rule number and rule name may be associated with each rule to make it easier to refer to the different sampling rules. Table 1 depicts seven numbered rules and their associated rule names. The logical statements describing when the sampling rule applies can be referred to as a matching rule set. The matching rule set for each rule is set forth in Table 1.

When a decision is made as to whether or not a lot should be marked or tagged for sampling, there is information associated with that lot (e.g., route, operation, product, etc.) that is normally thought of as lot context information. Additionally, the lot will normally have a processing history, e.g., which entities, i.e., process tools, were used to process the lot at a particular processing operation, e.g., an etching operation, a masking operation, a photoresist strip operation, etc. In some cases, the logical statements in a matching rule set may combine information from these sources. If all the logical statements in the matching rule set are satisfied, i.e., true, then that rule applies for the lot.

The matching rule sets may be very simple or complex depending upon the requirements of the rule and the manufacturing processes or products to be analyzed. As stated above, Table 1 depicts some sample examples of illustrative matching rule sets. The first five rules are examples of defining a rule set based on history information, i.e., which entity was used at which prior operation. The sixth rule is based upon the context of the lot, i.e., what product is being manufactured in the lot. The seventh rule is based upon a combination of both lot context and lot history information.

The particular codes and rule names set forth in Table 1 are simply illustrative examples. In practice, such codes and names may be tailored or modified for a specific application. For example, the rule name (E40M1CD) for the first rule is associated with the first metal layer (metal one) critical dimension (M1CD) metrology process (operation 5305) and the etch tool number 40 (E40). The matching rule set is satisfied if the entity is etch tool number 40 (ET40) at the metal one etch process (operation 5230). Similar descriptive designations are applied with respect to other rules. For example, rule number 2 (E40M1FI) represents the final inspection (FI) metrology process. The final inspection metrology is performed after the etch process is completed and the photomask is removed. The operation 5315 represents a final inspection metrology operation. In Table 1, the rule name with the prefix "E39" is associated with etch tool number 39. The prefix "STP64" in rule number 5 is associated with stepper tool number 64 and the operation 5170 (in the associated rule set) represents the metal one masking operation. Thus, the rule set for rule number 5 is satisfied when stepper tool number 64 is used in the metal one masking layer process (5170). The sixth rule (RO2DM1CD) is directed to a specific product (98RO2D) and the rule set is satisfied when the identified product is in the processed lot.

The seventh rule (My Rule) is a rule that includes a combination of lot context and lot history information. The illustrative rule set for rule 7 is satisfied when the 98M16B product is manufactured, stepper tool 64 is used in the metal one masking process (operation 5170) and etch tool 38 is used in the metal one etch process (operation 5230). A variety of logical statements may be combined to arrive at a particular rule set. For example, more complicated statements involving other comparisons, e.g., less than or equal to ($\leq$), greater than or equal to ($\geq$), additional logical operators, e.g., OR, XOR, NOT, etc., or wild cards, e.g., 98RO2*, could be incorporated into the rule set definition. Additionally, the rule set could apply to more than one metrology operation, e.g., metal one critical dimension metrology (operation 5305) and metal level two critical dimension metrology (operation 6585).

After the rule sets are defined, a sampling weight is assigned to each rule, as indicated in Table 2. This sampling weight is not a sampling percentage or a sampling pattern. Almost every rule may have a weight associated with it, although there may be situations where that is not the case. The sampling weight is a positive number. The larger the sampling weight, the higher the probability of a lot being marked for sampling due to that rule.

An additional aspect of the present invention relates to the "state" of the sampling rule. The state refers to the cumulative probability that a lot should be sampled. Each time a lot satisfies the matching rule set for a sampling rule, the weight for that rule is added to the rule state. Tables 3 and 4 provide simplified examples of this aspect of the present invention. Table 3 is a table reflecting the processing history of various lots. For example, lot J10 contains product 98RO2D and the metal one masking operation (5170) was performed by stepper number 65 (STP65) while the metal one etch process (5230) was performed by etch tool 39 (ET39). Table 4 depicts the states for the various rules as the lots identified in Table 3 are processed in order. For simplicity and ease of explanation, only the rules for metal one critical dimension metrology process (operation 5305) will be depicted. A dash ("-") in Table 4 (a table of rule states) means that the matching rule set for that rule did not apply to the lot in question. Basically, Table 4 is a cumulative weighted counter that describes how long it has been since metrology sampling processes have been performed on a lot that satisfies the matching rule set for a given rule.

The rule states depicted in Table 4 are then compared to a metrology trigger value to determine whether or not a lot should be marked or tagged for metrology sampling. Each metrology operation is given a numeric trigger value that is compared to the rule state. If the rule state is equal to or greater than the metrology trigger value, then the lot is marked for metrology sampling. Table 5 depicts trigger values for various metrology operations and indicates whether metrology sampling should be performed based on the various rule states (from Table 4). As can be seen, metrology sampling is indicated for lots J60, J70 and J80, because the rule states exceed the trigger value specified for metal one critical dimension metrology process (operation 5305). For example, lot J60 should be sampled because the state (50) of rule 6 (RO2M1CD) is equal to the trigger value of 50, lot J70 should be sampled because the state (60) of rule 3 (E39M1CD) exceeds the trigger value of 50, and lot J80 should be sampled because the state (60) of rule 6 (RO2M1CD) exceeds the trigger value of 50.

An alternative method of comparing individual rule states to trigger values would be to compare the sum of all rule states to the metrology trigger values. For example, under such an approach, lot J30 would have been tagged for metrology sampling because the sum of its two applicable rule states, 30 for rule 3 (E39M1CD) and 30 for rule 6 (RO2M1CD) is greater than the trigger value of 50. Such a method would have the benefit that lots selected for metrology sampling will typically be those that satisfy a large number of sampling rules. However, such an approach may be difficult to implement due to difficulties in determining appropriate trigger values. Under a methodology where all rule states are added together and compared to a trigger value, adding any additional rules effectively reduces the trigger values previously described. For example, defining an additional rule based on an additional entity type would add its state to the states for etchers and steppers already defined. Any time a new rule was added, all metrology trigger values possibly affected would need to be re-evaluated. Thus, in one illustrative embodiment of the present invention, each rule state is individually compared to the metrology trigger values to determine if metrology sampling is warranted.

Another aspect of the present invention relates to resetting the rule states. When a lot is marked for metrology sampling, the state of every rule whose matching rule set was satisfied is reset. During the resetting process, the states for the rules are reduced by an amount equal to the trigger value to a minimum value of zero. This resetting process, in effect, shares the sampling decision from one rule to all rules. Table 6 shows the rule states after metrology sampling decisions have been made. Where a lot is designated for metrology sampling, two rule states are provided (in bold). The first value is the state of the rule prior to the sampling decision, while the second value is the state of the rule after the reset process.

Note also that in the rules, the values for lot J80 for rules 1 and 6 have also been reduced to a value of 10. This reflects that a particular rule, e.g., rule 6, was reset to zero (for lot J60) during the resetting process. Thus, the next entry for lot J80 when the rule 6 is satisfied is given a sample weighting of 10. A similar situation occurs for lot J80 and rule 1.

There are other possible methods of resetting the trigger values. For example, only rules whose state values exceed the metrology sampling trigger values may be reset. However, under this methodology, different rules would be applied independently and might result in either over-sampling or an inadequate set of defined rules to ensure sampling from all tool types. Another approach might be to reset all applicable rule states to zero instead of subtracting the trigger values. Such a methodology effectively eliminates all sampling rates other than "1/n" sampling rates, e.g., ½, ⅓, ¼, etc. Moreover, the amount that a rule state exceeds the trigger value represents the amount the sampling was "overdue." Such information is preserved in the methodology described above. Another possible alternative is to subtract the trigger value from the rule state without using a lower limit of zero. However, such a methodology could potentially create a situation where more material was processed without sampling than is desirable.

The methods and systems described herein are very flexible and may be used with various different types of rules. For example, the present invention may be employed with standard rules, absolute rules and/or temporary rules. Standard rules may be a rule wherein metrology sampling decisions are based upon the lot context and/or processing history of the lot. For example, such rules may be based upon a desire to sample a certain percentage of processing tools or products. Such a standard rule is not limited to tool types, and it could include any information available to the system—equipment identification, product names, routes, lot attribute values, or a combination of such item of information. Such a standard rule would include a matching rule set and a sampling weight. There may also be a need for absolute rules for metrology sampling, e.g., every lot of a specific product must be measured, all lots through a particular operation must be measured, every lot of a certain priority should never be measured, etc. While such absolute rules may not have sampling weights of their own, they should be incorporated into the system so that the states of other rules that apply to the lot could be updated appropriately. Absolute rules may be incorporated into the system because the measurement of a lot due to an absolute rule may also satisfy a standard rule. As an example, an absolute rule may state that every lot that ran on stepper STP67 at the masking operation (5170) should be marked for metrology at operation 5305. Those lots will be processed through some etch tool (e.g., ET40) at the metal one etch operation (5230). If all lots marked due to the absolute rule are ignored, then some lots that were processed on the etch tool ET40 (Rule #1) will be ignored. This would result in a higher than anticipated sampling rate for the etch tool ET40 under Rule #1 If, however, the absolute rule is incorporated into the update, then Rule #1 will be appropriate.

In some cases, it may be desirable to apply rules that are temporary in nature. For example, it may be desirable to mark all lots processed in a 24-hour period for measurement. Such temporary rules may or may not have a sampling weight associated with the rule. As should be clear from the above, the exemplary identification of various rules that may be employed with the present invention is by no means exhaustive. Thus, the present invention should not be considered as limited to any particular type of rule, unless such limitations are expressly set forth in the appended claims.

Another aspect of the present invention relates to the timing of the sampling decision. In one illustrative embodiment, the decision to perform metrology sampling is typically delayed as long as possible because the sampling rules may depend on historical information. In practical terms, this means that the decision as to whether or not a lot should be sampled should be delayed until right before the lot would be moved into that metrology operation. At any other time, there may not be sufficient information to determine all rules which might apply.

Delaying the sampling decision this long may raise other issues. In current sampling systems, the lots are marked for metrology as they are processed on a process tool, e.g., an etch tool or a stepper. This methodology insures that the sampling decision is made in the same order that the lots are processed. For example, one lot out of every ten lots processed through a particular etcher will be marked for metrology sampling. In the present invention, it is likely that the lots would be in a different order as they proceed through the metrology operation as compared to the order they were in during the process operation. While a similar rule could be defined to insure that one out of every ten lots processed through a particular process tool would be marked for metrology sampling, the difference is that it would be one out of every ten lots as they enter the metrology operation instead of one out of every ten lots as they left the processing tool. It may be possible to maintain a list of lots processed on each tool in the order they were processed. Such information could be used to reconstruct the processing order to be used in the sampling decision.

To maintain flexibility and ease of access, most information for the system, e.g., rules definitions, trigger values, etc., may be maintained within a database. The database should have interfaces to allow for either manual or automated updates of any components or values in the system. For example, it may be desirable to update the trigger value for a particular metrology operation. Alternatively, an automated control application may be employed to update the sampling weight for a given rule to make sampling more or less likely. The exact structure of the database(s) and associated interfaces may vary.

One benefit of the system is that by moving from percentages or patterns to weights and triggers is that modifying sampling rates can be done quite easily by updating the trigger values. Most existing systems effectively define a trigger value either by a pattern or by a percentage, e.g., 70%. These trigger values cannot be readily changed. In order to change the sampling rate at an operation, each individual rule must be updated. Under the proposed system, a single trigger value could be changed to adjust the sampling rate. As an example, if the current sampling trigger is set at 100, changing it to 200 would effectively reduce the sampling rate by one-half. Future work could be done to automatically adjust trigger values based on available metrology capability in a factory. For example, if one of the CD-SEM metrology tools were taken out of production, the trigger values could be automatically adjusted for CD-SEM metrology operations to ensure that the remaining tools were not overloaded with workpieces.

The system of weights and trigger values could also be used as a component of prioritizing lots in dispatch queues. The ratio of the highest rule state for a lot to the trigger value for the metrology step can be used as an indication of priority. The higher the ratio, the more the sampling is "needed" to satisfy sampling rules. An example of this would be if two lots were marked for metrology. The first lot had a cumulative weight of 150 for an operation with a trigger value of 100. The second lot had a cumulative weight of 210 for an operation with a trigger value of 200. The ratio for the first lot is 1.5 while the second is 1.05. All other things being equal, the first lot should be given higher priority in the dispatch queue.

FIG. 1 is a schematic depiction of an illustrative manufacturing operation 10 wherein a plurality of process tools 12 are employed. One or more controllers 14, one of which is schematically depicted in FIG. 1, may be used to control one or more aspects of the various processes performed in the process tools 12 and/or to implement the adaptive sampling plan and methodologies described herein. It should be understood that the process tools 12 depicted in FIG. 1 are illustrative in nature as they may represent any type of tool capable of performing any type of manufacturing process. Of course, the process tools 12 may each perform different types of manufacturing operations. Moreover, workpieces may be processed through the tools 12 in any order, and some tools 12 may perform process operations that must be performed prior to processing operations performed in other tools 12. In the context of semiconductor manufacturing operations, the generic process tools 12 may be a combination of stepper tools, etch tools, deposition tools, ion implant tools, furnaces, etc.

Also depicted in FIG. 1 are a plurality of illustrative metrology tools 16. The metrology tools 16 are representative in nature in that they represent any type of metrology tool capable of performing any type of metrology process. The metrology tools 16 may be used to acquire metrology data regarding any aspect of the various processing operations performed by one or more of the process tools 12, or to acquire metrology data regarding a product or feature produced by the tools 12. In the context of semiconductor manufacturing operations, the metrology tools 16 may be used to acquire critical dimension data, thickness data, particle defect data, electrical performance data, photolithography overlay measurements, deposited film properties (e.g., resistivity, stress, optical properties), surface profile data, data regarding the effectiveness of a stepper exposure process an etching process, a deposition process, a chemical mechanical polishing process, an ion implant process or an anneal process. Illustrative examples of such metrology tools 16 for use in semiconductor manufacturing operations include, but are not limited to, scanning electron microscopes, ellipsometers, profilometers, four-point probes, overlay tools, etc.

A controller 18 may be operatively coupled to the ion implant tool 10 and it may be any type of device capable of executing instructions. In some embodiments, the controller 18 may be a microprocessor or a computer. The controller 18 may be resident on the ion implant tool 10, it may be a stand-alone device, or it may be part of an overall computer system that is adapted to control one or more aspects of the operations performed in an integrated circuit manufacturing facility. The controller 18 may be employed to perform various functions described herein. The functions performed by the controller 18 may be performed by multiple computing resources.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI, which is headquartered in Mountain View, Calif.

The present invention is generally directed to various methods and systems for adaptive metrology sampling plans that may be employed to monitor various manufacturing processes. In one illustrative embodiment, the method comprises creating a plurality of metrology sampling rules, assigning each of the metrology sampling rules a sampling weight value, identifying at least one workpiece that satisfies at least one of the metrology sampling rules, associating the sampling weight value for each of the satisfied metrology sampling rules with the identified workpieces that satisfy the rules, and indicating a metrology operation should be performed when a cumulative total of the sampling weight values is at least equal to a pre-established trigger value. In another embodiment, the method comprises indicating a metrology operation should be performed when a cumulative total of the sampling weight values for one of the metrology sampling rules is at least equal to a pre-established trigger value. In yet another embodiment, the method comprises indicating a metrology operation should be performed when a cumulative total of the sampling weight values for one of the workpieces is at least equal to a pre-established trigger value. In the context of semiconductor processing operations, the workpieces are lots of semiconducting wafers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    creating a plurality of metrology sampling rules;
    assigning each of said plurality of metrology sampling rules a sampling weight value;
    identifying at least one workpiece that satisfies at least one of said plurality of metrology sampling rules;
    associating said sampling weight value for each of said satisfied metrology sampling rules with said identified workpieces that satisfy said rules; and
    indicating a metrology operation should be performed when a cumulative total of said sampling weight values is at least equal to a pre-established trigger value.

2. The method of claim 1, wherein said plurality of metrology sampling rules have different sampling weight values.

3. The method of claim 1, wherein at least some of said plurality of metrology sampling rules have the same sampling weight value.

4. The method of claim 1, wherein said workpiece is a lot of semiconducting wafers.

5. The method of claim 1, wherein said metrology operation is at least one of a critical dimension measuring operation and a defect inspection metrology operation.

6. The method of claim 1, wherein said at least one workpiece is processed in a semiconductor manufacturing facility.

7. The method of claim 1, wherein indicating a metrology operation should be performed comprises indicating a metrology operation should be performed when a cumulative total of said sampling weight values for one of said plurality of metrology sampling rules is at least equal to a pre-established trigger value.

8. The method of claim 1, wherein indicating a metrology operation should be performed comprises indicating a metrology operation should be performed when a cumulative total of said sampling weight values for one of said workpieces is at least equal to a pre-established trigger value.

9. The method of claim 4, wherein said plurality of metrology sampling rules are based upon at least one of lot context information and lot history information.

10. The method of claim 1, further comprising reducing said cumulative total of said sampling weights by the value of said trigger value when there is an indication that said metrology operation should be performed.

11. The method of claim 1, further comprising reducing said cumulative total of said sampling weights by the value of said trigger value to a minimum value of zero when there is an indication that said metrology operation should be performed.

12. The method of claim 1, further comprising performing said indicated metrology operation.

13. A method, comprising:
creating a plurality of metrology sampling rules;
assigning each of said plurality of metrology sampling rules a sampling weight value;
identifying at least one workpiece that satisfies at least one of said plurality of metrology sampling rules;
associating said sampling weight value for each of said satisfied metrology sampling rules with said identified workpieces that satisfy said rules; and
indicating a metrology operation should be performed when a cumulative total of said sampling weight values for one of said plurality of metrology sampling rules is at least equal to a pre-established trigger value.

14. The method of claim 13, wherein said plurality of metrology sampling rules have different sampling weight values.

15. The method of claim 13, wherein at least some of said plurality of metrology sampling rules have the same sampling weight value.

16. The method of claim 13, wherein said workpiece is a lot of semiconducting wafers.

17. The method of claim 13, wherein said metrology operation is at least one of a critical dimension measuring operation and a defect inspection metrology operation.

18. The method of claim 13, wherein said at least one workpiece is processed in a semiconductor manufacturing facility.

19. The method of claim 16, wherein said plurality of metrology sampling rules are based upon at least one of lot context information and lot history information.

20. The method of claim 13, further comprising reducing said cumulative total of said sampling weights by the value of said trigger value when there is an indication that said metrology operation should be performed.

21. The method of claim 13, further comprising reducing said cumulative total of said sampling weights by the value of said trigger value to a minimum value of zero when there is an indication that said metrology operation should be performed.

22. The method of claim 13, further comprising performing said indicated metrology operation.

23. A method, comprising:
creating a plurality of metrology sampling rules;
assigning each of said plurality of metrology sampling rules a sampling weight value;
identifying at least one workpiece that satisfies at least one of said plurality of metrology sampling rules;
associating said sampling weight value for each of said satisfied metrology sampling rules with said identified workpieces that satisfy said rules; and
indicating a metrology operation should be performed when a cumulative total of said sampling weight values for one of said workpieces is at least equal to a pre-established trigger value.

24. The method of claim 23, wherein said plurality of metrology sampling rules have different sampling weight values.

25. The method of claim 23, wherein at least some of said plurality of metrology sampling rules have the same sampling weight value.

26. The method of claim 23, wherein said workpiece is a lot of semiconducting wafers.

27. The method of claim 23, wherein said metrology operation is at least one of a critical dimension measuring operation and a defect inspection metrology operation.

28. The method of claim 23, wherein said at least one workpiece is processed in a semiconductor manufacturing facility.

29. The method of claim 26, wherein said plurality of metrology sampling rules are based upon at least one of lot context information and lot history information.

30. The method of claim 23, further comprising reducing said cumulative total of said sampling weights by the value of said trigger value when there is an indication that said metrology operation should be performed.

31. The method of claim 23, further comprising reducing said cumulative total of said sampling weights by the value of said trigger value to a minimum value of zero when there is an indication that said metrology operation should be performed.

32. The method of claim 23, further comprising performing said indicated metrology operation.

* * * * *